United States Patent
Yang et al.

(10) Patent No.: US 12,193,259 B2
(45) Date of Patent: Jan. 7, 2025

(54) FLEXIBLE SUPPORTING LAYER AND FLEXIBLE DISPLAY DEVICE

(71) Applicants: Chengdu BOE Optoelectronics Technology Co., Ltd., Sichuan (CN); BOE Technology Group Co., Ltd., Beijing (CN)

(72) Inventors: Shuquan Yang, Beijing (CN); Liqiang Chen, Beijing (CN); Chengchung Yang, Beijing (CN); Yang Gao, Beijing (CN); Chao Yang, Beijing (CN); Ziqi Song, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 318 days.

(21) Appl. No.: 17/801,702

(22) PCT Filed: Oct. 11, 2021

(86) PCT No.: PCT/CN2021/123115
§ 371 (c)(1),
(2) Date: Aug. 23, 2022

(87) PCT Pub. No.: WO2022/111080
PCT Pub. Date: Jun. 2, 2022

(65) Prior Publication Data
US 2023/0165039 A1    May 25, 2023

(30) Foreign Application Priority Data
Nov. 25, 2020    (CN) .......................... 202011335061.5

(51) Int. Cl.
*G06F 1/16*    (2006.01)
*H10K 50/844*    (2023.01)
*H10K 102/00*    (2023.01)

(52) U.S. Cl.
CPC ......... *H10K 50/844* (2023.02); *G06F 1/1652* (2013.01); *G06F 1/1656* (2013.01); *H10K 2102/311* (2023.02)

(58) Field of Classification Search
CPC .............................. G06F 1/1652; G09F 9/301
See application file for complete search history.

(56) References Cited

U.S. PATENT DOCUMENTS

2019/0251876 A1    8/2019    Kim
2023/0269890 A1*   8/2023    Choi .................... H05K 5/0217
                                                      361/807

FOREIGN PATENT DOCUMENTS

| CN | 109599503 A | 4/2019 |
| CN | 110061039 A | 7/2019 |
| CN | 110992837 A | 4/2020 |
| CN | 112436041 A | 3/2021 |
| CN | 113470535 A | 10/2021 |

* cited by examiner

*Primary Examiner* — Anthony Q Edwards
(74) *Attorney, Agent, or Firm* — IPro, PLLC

(57) ABSTRACT

A flexible supporting layer and a flexible display device. The flexible supporting layer is applied in a flexible display device, and the content of a flexible supporting layer material per unit volume increases in the curl direction of the flexible display device.

20 Claims, 4 Drawing Sheets

| cover plate | — 11 |
| second optical adhesive layer | — 10 |
| touch layer | — 9 |
| polarizer | — 8 |
| first optical adhesive layer | — 7 |
| encapsulation layer | — 6 |
| light-emitting device | — 5 |
| drive backboard | — 4 |
| flexible substrate | — 3 |
| back film | — 2 |
| supporting layer | — 1 |

--Prior Art-- ved by the embodiments of the present disclosure, in the curl direction of the flexible display apparatus, lengths and widths of the plurality of grooves are the same, and depths of the grooves in different unit volumes decrease.

FLEXIBLE SUPPORTING LAYER AND FLEXIBLE DISPLAY DEVICE

CROSS REFERENCE TO RELATED APPLICATIONS

The present application is a national phase entry under 35 U.S.C § 371 of International Application No. PCT/CN2021/123115, filed on Oct. 11, 2021, which claims priority to Chinese Patent Application No. 202011335061.5, filed to the China National Intellectual Property Administration on Nov. 25, 2020 and entitled "FLEXIBLE SUPPORTING LAYER AND FLEXIBLE DISPLAY DEVICE", the entire contents of which are incorporated herein by reference.

FIELD

The present disclosure relates to the field of display, in particular to a flexible supporting layer and a flexible display apparatus.

BACKGROUND

Flexible display is an important development direction of a display technology, which has characteristics of being flexible, breakage-proof, super light and super thin, low in power consumption and portable, and has wide application prospects and good development anticipation in fields such as electronic books, mobile communication, notebooks, televisions and public information.

SUMMARY

Embodiments of the present disclosure provide a flexible supporting layer, the flexible supporting layer is applied in a flexible display apparatus, and in a curl direction of the flexible display apparatus, a content of a material of the flexible supporting layer per unit volume increases.

Optionally, in the above flexible supporting layer provided by the embodiments of the present disclosure, the flexible supporting layer is provided with a plurality of grooves, and in the curl direction of the flexible display apparatus, a proportion of grooves per unit volume decreases.

Optionally, in the above flexible supporting layer provided by the embodiments of the present disclosure, the plurality of grooves are arranged in an array, the plurality of grooves are of a same size, and in the curl direction of the flexible display apparatus, the quantity of the grooves per unit volume decreases.

Optionally, in the above flexible supporting layer provided by the embodiments of the present disclosure, the plurality of grooves are arranged in an array, and in the curl direction of the flexible display apparatus, the quantity of the grooves per unit volume is the same, and sizes of the grooves in different unit volumes decrease.

Optionally, in the above flexible supporting layer provided by the embodiments of the present disclosure, depths of all the plurality of grooves are the same, and in the curl direction of the flexible display apparatus, lengths of the grooves in different unit volumes are the same, and widths of the grooves in different unit volumes decrease.

Optionally, in the above flexible supporting layer provided by the embodiments of the present disclosure, depths of all the plurality of grooves are the same, and in the curl direction of the flexible display apparatus, lengths of the grooves in different unit volumes decrease, and widths of the grooves in different unit volumes are the same.

Optionally, in the above flexible supporting layer provided by the embodiments of the present disclosure, the plurality of grooves are a plurality of vias penetrating through the flexible supporting layer.

Optionally, in the above flexible supporting layer provided by the embodiments of the present disclosure, in the curl direction of the flexible display apparatus, lengths and widths of the plurality of grooves are the same, and depths of the grooves in different unit volumes decrease.

Optionally, in the above flexible supporting layer provided by the embodiments of the present disclosure, shapes of the grooves include a rectangle, a square, a circle, an ellipse or an irregular shape.

Optionally, in the above flexible supporting layer provided by the embodiments of the present disclosure, a material of the flexible supporting layer is metal, and the metal is a stainless steel or a shape memory alloy.

Accordingly, the embodiments of the present disclosure further provide a flexible display apparatus, including:
a flexible substrate;
a flexible display device, arranged on the flexible substrate; and
the above flexible supporting layer provided by the embodiments of the present disclosure, arranged on a side of the flexible substrate facing away from the flexible display device.

Optionally, the above flexible display apparatus provided by the present disclosure further includes a drive circuit layer arranged between the flexible display device and the flexible substrate, a back film arranged between the flexible substrate and the flexible supporting layer and an encapsulation layer, a first adhesive layer, a polarizer, a touch layer, a second adhesive layer and a cover plate which are stacked in sequence and arranged on a side of the flexible display device facing away from the flexible substrate.

DETAILED DESCRIPTION OF THE EMBODIMENTS

In order to make objectives, technical solutions and advantages of the embodiments of the present disclosure clearer, the technical solutions of the embodiments of the present disclosure will be clearly and completely described below with reference to the accompanying drawings of the embodiments of the present disclosure. Obviously, the described embodiments are some, but not all, embodiments of the present disclosure. Moreover, without conflict, the embodiments in the present disclosure and the features in the embodiments can be combined with each other. Based on the embodiments in the present disclosure, all other embodiments acquired by those of ordinary skill in the art without creative work shall fall within the protection scope of the present disclosure.

Unless otherwise defined, technical or scientific terms used herein should have the ordinary meaning as understood by ordinary skill in the art to which the present disclosure belongs. "Comprise" or "include" and similar words mean that the elements or objects appearing before the word cover the elements or objects recited after the word and their equivalents, but do not exclude other elements or objects. Similar words such as "connect" or "link" are not limited to physical or mechanical connection, but may include electrical connection, whether direct or indirect. "Inner", "outer", "upper", "lower" and the like are merely used to represent a relative position relationship, and after an absolute position of a described object is changed, the relative position relationship may also be changed accordingly.

It should be noted that the sizes and shapes of various patterns in the accompanying drawings do not reflect the true proportions, and are only intended to illustrate the content of the present disclosure schematically. In addition, the same or similar numerals refer to the same or similar elements or elements having the same or similar functions throughout.

Figures 1, 2:
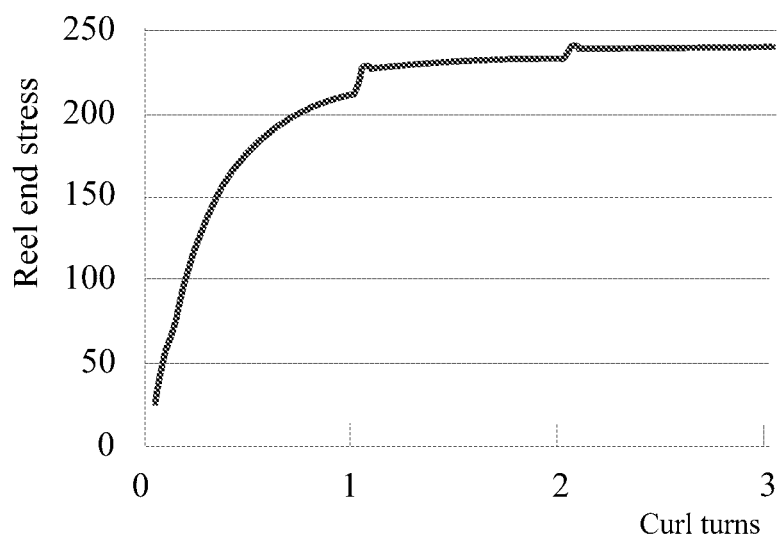
FIG. 1 is a schematic cross-sectional view of a flexible display apparatus provided in the related art.
FIG. 2 is a schematic diagram of a relationship between curl turns and stress of a flexible display apparatus provided by an embodiment of the present disclosure.

A flexible display module needs to be deformed with different forms, such as curling and bending, so a thickness of a film layer included in the module is constantly thinned, for example, a traditional glass cover plate is changed into a flexible CPI (transparent PI) cover plate. However, in the use process of products, in addition to that the module may perform flexible deformation, it also needs to have certain supporting and rebound resilience to guarantee use experience and touch feeling in the use process, so that metal strutting components with excellent rebound resilience are generally attached to the display module. A traditional flexible display module, as shown in FIG. 1, includes a cover plate 11, a second adhesive layer 10, a touch layer 9, a polarizer 8, a first adhesive layer 7, an encapsulation layer 6, a light-emitting device 5, a drive circuit layer 4, a flexible substrate 3, a back film 2 and a flexible supporting layer 1 which are stacked in sequence from top to bottom, a whole face of the flexible supporting layer 1 is evenly arranged, and the flexible supporting layer 1 further has functions of shading, electromagnetic shielding and heat conducting.

For a flexible display module in a new form motion mode, such as curl products, more than 3 turns of curling are often performed, and in order to enable the display module to curl and unfold according to an ideal pattern, a certain stress needs to be applied to the display module. However, the display module itself has a certain thickness, so in the curling and flattening process, inner and outer film layers of the display module may be subjected to certain stress accumulation, and with continuous winding of a flexible display panel, stress will be gradually accumulated. Taking curling as an example, as shown in FIG. 2, FIG. 2 shows a relationship between the maximum stress on a material at a reel end of the flexible display module in the curling process and the quantity of the curl turns, it can be seen that with increasing of the curl turns, the stress accumulation of the material at the reel end is larger, which is prone to being the source of failure. Therefore, when the flexible display module is continuously wound to form a roller structure, a part, away from a central axis of the roller structure, accumulates more stress, that is, more stress is accumulated at the winding end, thus, the condition that each layer of structure in the flexible display module is prone to being broken at the winding end or parts between each layer of structure are prone to peeling off at the winding end may occur, and the dependability of the flexible display module is reduced.

In order to reduce the stress accumulated at the winding end, the embodiments of the present disclosure provide a flexible supporting layer, as shown in FIG. 3 to FIG. 6, the flexible supporting layer 1 is used in a flexible display apparatus, and in a curl direction (as shown by an arrow) of the flexible display apparatus, a content of a material of the flexible supporting layer 1 per unit volume increases.

According to the above flexible supporting layer provided by the embodiments of the present disclosure, the flexible supporting layer 1 is applied in the flexible display apparatus, and in the curl direction of the flexible display apparatus, the content of the material of the flexible supporting layer 1 per unit volume increases. That is, by arranging the material of the flexible supporting layer 1 with an adjustable modulus, the equivalent modulus of the material in a part of the flexible supporting layer as a curl inner circle layer is reduced to meet the curl deformation demand, the equivalent modulus of the material in an another part of the flexible supporting layer as a curl outer circle layer is increased, thereby minimizing the film layer deformation caused by stress accumulation. When the flexible supporting layer 1 of the embodiments of the present disclosure is applied to the flexible display apparatus, the equivalent modulus of the material of the flexible supporting layer may be adjusted to reduce the stress accumulation borne by the material of the outermost curl circle, so that accumulation of much stress at the winding end is avoided, thus, the condition that each layer of structure in the flexible display apparatus is prone to being broken at the winding end or the parts between each layer of structure are prone to peeling off at the winding end is avoided, and the dependability of the flexible display module is improved. In addition, because the film material production process of an upper layer of the flexible substrate in the flexible display apparatus is mostly coiled material cutting molding, in addition, in order to meet the evenness of thickness and optical functions, equivalent modulus adjustment is difficult to carry out. In the present disclosure, by adopting the patterned flexible supporting layer, equivalent modulus of the whole material of the display apparatus at different regions may be readjusted to meet the requirements of different deformation modes for the flexible supporting layer.

It needs to be illustrated that the modulus means a proportion of stress to strain of the material under a stress state. An elastic modulus may be regarded as an index to measure a degree of difficulty in producing elastic deformation of a material, the greater its value is, the greater the stress of the material to produce certain elastic deformation is, namely, the greater the material stiffness is, that is, the less elastic deformation occurs under certain stress. Generally, the greater the content of the material is, the greater the stiffness is. Therefore, it may be understood that in the curl direction of the above-mentioned flexible display apparatus, the content of the material of the flexible supporting layer per unit volume increases, that is, in the curl direction of the flexible display apparatus, the modulus of the material of the flexible supporting layer per unit volume increases, that is, the stiffness of the material of the flexible supporting layer increases.

Specifically, in the flexible supporting layer provided by the embodiments of the present disclosure, as shown in FIG. 3 to FIG. 6, in the curl direction of the flexible display apparatus, the modulus of the material of the flexible supporting layer 1 increases. When the modulus of a material of a film layer is large, the deformation borne the same stress is smaller, larger outside stress may be absorbed not to cause breakage between the film layers, thus, the outer circle layer with larger modulus may absorb larger outside stress not to cause breakage between the film layers. When the modulus of the material of the film layers is small, the deformation borne the same stress is larger, stress accumulation may be absorbed through itself deformation, thus, the inner circle layer with smaller modulus may absorb stress accumulation through itself deformation. Thus, by adopting the patterned flexible supporting layer, the equivalent modulus of the whole material of the display apparatus at different regions may be readjusted to meet the requirements of different deformation modes for the flexible supporting layer.

Optionally, in the flexible supporting layer provided by the embodiments of the present disclosure, as shown in FIG. 3 to FIG. 6, the flexible supporting layer 1 has a plurality of grooves 01, and in the curl direction (as shown by the arrow) of the flexible display apparatus, a proportion of grooves 01 per unit volume decreases.

Figure 3:
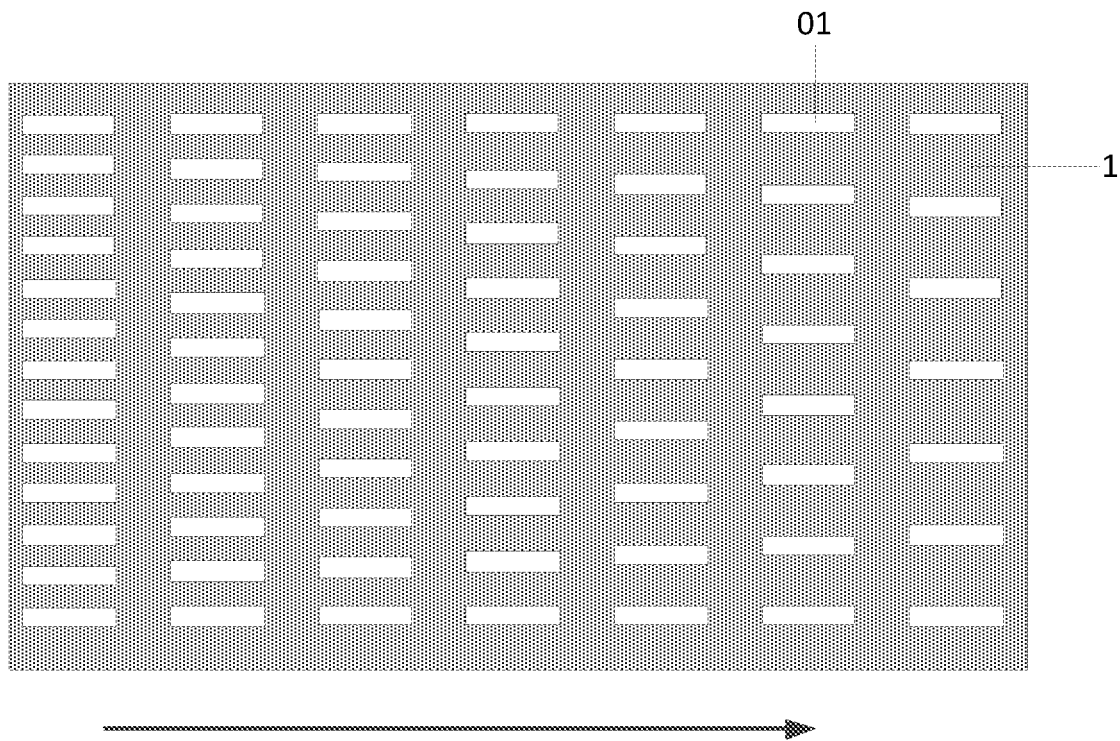
FIG. 3 is a schematic top view of a flexible supporting layer provided by an embodiment of the present disclosure.

Optionally, in the flexible supporting layer provided by the embodiments of the present disclosure, as shown in FIG. 3, the plurality of grooves 01 are arranged in an array, sizes of all the plurality of grooves 01 are the same, and in the curl direction (as shown by the arrow) of the flexible display apparatus, the quantity of the grooves 01 per unit volume decreases. That is, in the curl direction (as shown by the arrow) of the flexible display apparatus, density of the grooves 01 decreases, the influence of different density of opening on the film layer modulus may be concluded by material object testing, and may be evaluated through finite element simulation analysis.

Figure 4:
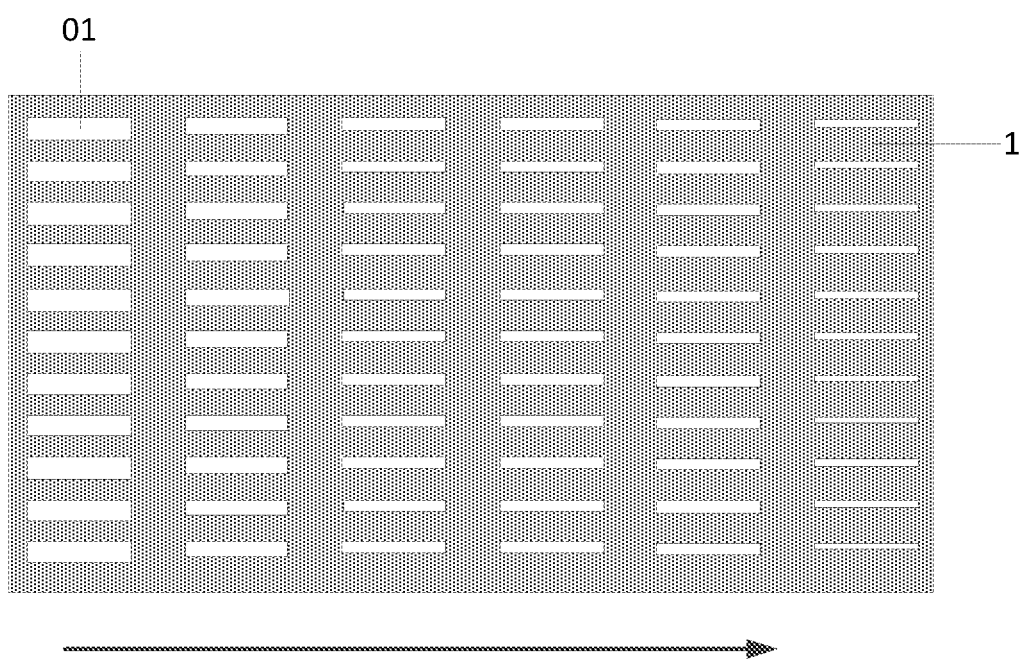
FIG. 4 is a schematic top view of another flexible supporting layer provided by an embodiment of the present disclosure.
Figure 5:
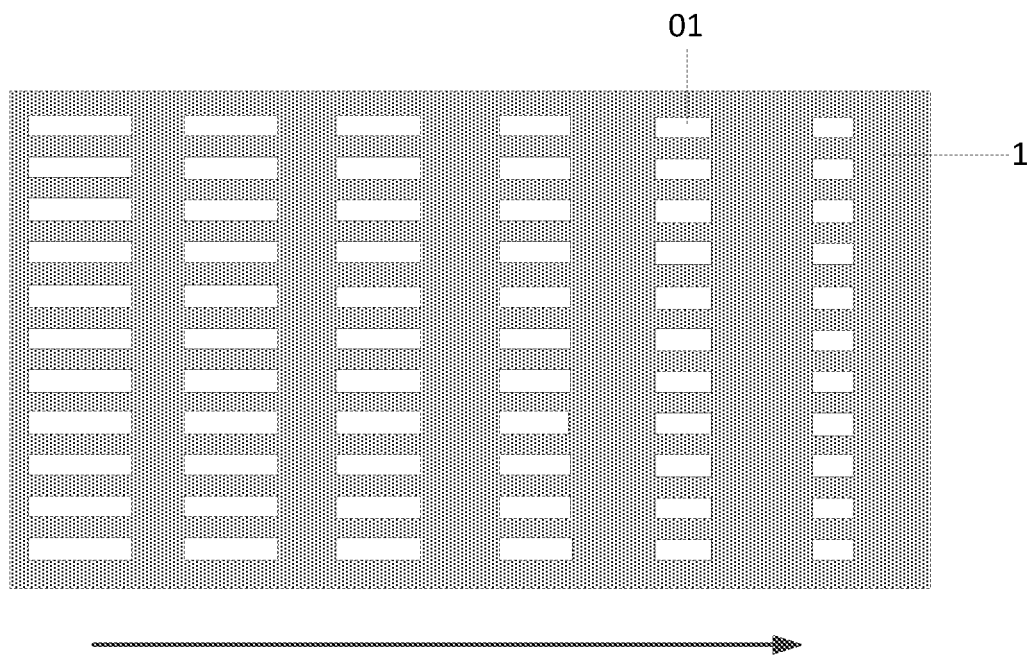
FIG. 5 is a schematic top view of yet another flexible supporting layer provided by an embodiment of the present disclosure.

Optionally, in the flexible supporting layer provided by the embodiments of the present disclosure, as shown in FIG. 4 and FIG. 5, the plurality of grooves 01 are arranged in an array, and in the curl direction (as shown by the arrow) of the flexible display apparatus, the quantity of the grooves 01 per unit volume is the same, and sizes of the grooves 01 in different unit volumes decrease. That is, in the present disclosure, the sizes of the grooves 01 are set to decrease, correspondingly, the modulus of the material of the flexible supporting layer 1 increase, so that the stress accumulation of the outer circle layer in the curling process of the flexible display apparatus is reduced, the condition that each layer of structure in the flexible display apparatus is prone to being broken at the winding end or parts between each layer of structure are prone to peeling off at the winding end is avoided, and the dependability of the flexible display apparatus is improved.

Optionally, in the flexible supporting layer provided by the embodiments of the present disclosure, as shown in FIG. 4, depths of the plurality of grooves 01 the flexible supporting layer are the same, in the curl direction (as shown by the arrow) of the flexible display apparatus, lengths of the grooves 01 in different unit volumes are the same, and widths of the grooves 01 in different unit volumes decrease. The sizes of the grooves 01 may be represented by volume, the volume is length×width×height (depth), the length and height are the same, the width decreases, thus, in the curl direction (as shown by the arrow) of the flexible display apparatus, the volumes of the grooves 01 decrease, correspondingly, the modulus of the material of the flexible supporting layer 1 increases, so that the stress accumulation of the outer circle layer in the curling process of the flexible display apparatus is reduced, the condition that each layer of structure in the flexible display apparatus is prone to being broken at the winding end or parts between each layer of structure are prone to peeling off at the winding end is avoided, and the dependability of the flexible display apparatus is improved.

Optionally, in the flexible supporting layer provided by the embodiments of the present disclosure, as shown in FIG. 5, depths of the plurality of grooves 01 of the flexible supporting layer are the same, in the curl direction (as shown by the arrow) of the flexible display apparatus, lengths of the grooves 01 in different unit volumes decreases, and widths of the grooves 01 in different unit volumes are the same. The sizes of the grooves 01 may be represented by volume, the volume is length×width×height (depth), the width and height are the same, the length decreases, thus, in the curl direction (as shown by the arrow) of the flexible display apparatus, the volumes of the grooves 01 decrease, correspondingly, the modulus of the material of the flexible supporting layer 1 increases, so that the stress accumulation of the outer circle layer in the curling process of the flexible display apparatus is reduced, the condition that each layer of structure in the flexible display apparatus is prone to being broken at the winding end or parts between each layer of structure are prone to peeling off at the winding end is avoided, and the dependability of the flexible display apparatus is improved.

As shown in FIG. 4 and FIG. 5, fine adjustment is performed on the shape of the opening to realize adjustment and control of the equivalent modulus of the material of the film layer. According to existing mechanical calculation experience, the shape of the opening may influence the equivalent modulus. Taking a rectangle opening as an example in a flexible supporting layer material region, the adjustment of the equivalent modulus may be realized by adjusting the lengths and widths of rectangle openings in different regions. A specific solution may also refer to a finite element simulation and physical testing result.

Optionally, in the flexible supporting layer provided by the embodiments of the present disclosure, as shown in FIG. 4 and FIG. 5, the plurality of grooves 01 may be vias penetrating through the flexible supporting layer 1. Specifically, processing technologies for opening the flexible supporting layer mainly include etching, stamping, wire-electrode cutting, laser cutting and the like, the plurality of grooves 01 are the vias penetrating through the flexible supporting layer 1, so that technological conditions manufacturing the grooves may be controlled to be consistent, and manufacturing is convenient.

It needs to be illustrated that FIG. 4 and FIG. 5 take an example that in the curl direction (as shown by the arrow) of the flexible display apparatus, the density (density of opening) of the plurality of grooves 01 is the same, FIG. 4 realizes that the modulus of the material of the flexible supporting layer 1 increases in the curl direction (as shown by the arrow) of the flexible display apparatus merely by changing the widths of different grooves 01. FIG. 5 realizes that the modulus of the material of the flexible supporting layer 1 increases in the curl direction (as shown by the arrow) of the flexible display device merely by changing the lengths of different grooves 01. Obviously, the situation that in the curl direction of the flexible display apparatus, the density (density of opening) of the grooves 01 decreases, and the lengths and/or widths of the grooves 01 also decrease may also be adopted. By reasonably adjusting the density of the grooves 01 and the lengths and/or widths of the grooves 01, it may also be realized that the modulus of the material of the flexible supporting layer 1 per unit volume increases in the curl direction of the flexible display apparatus.

Figure 6:
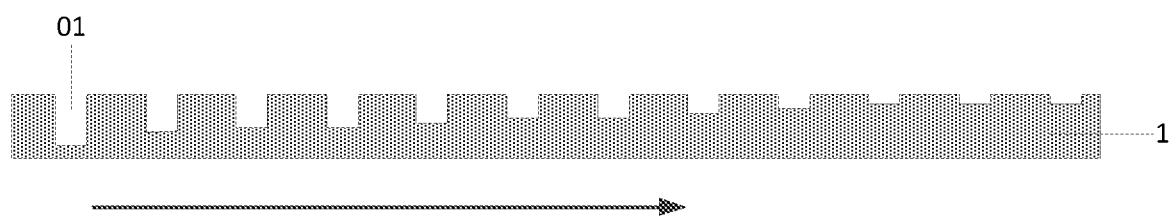
FIG. 6 is a schematic top view of yet another flexible supporting layer provided by an embodiment of the present disclosure.

Optionally, in the flexible supporting layer provided by the embodiments of the present disclosure, as shown in FIG. 6, in the curl direction (as shown by the arrow) of the flexible display apparatus, the lengths and widths of the plurality of grooves 01 are all the same, and the depths of the grooves 01 in different unit volumes decrease. The sizes of the grooves 01 may be represented by the volume, the volume is length×width×height (depth), the length and width are the same, the height decreases, thus, in the curl direction (as shown by the arrow) of the flexible display apparatus, the volumes of the plurality of grooves 01 decrease, correspondingly, the modulus of the material of the flexible supporting layer 1 increases, so that the stress accumulation of the outer circle layer in the curling process of the flexible display apparatus is reduced, the condition that each layer of structure in the flexible display apparatus is prone to being broken at the winding end or parts between each layer of structure are prone to peeling off at the winding end is avoided, and the dependability of the flexible display apparatus is improved.

Specifically, FIG. 6 takes an example that in the curl direction (as shown by the arrow) of the flexible display apparatus, the density (density of opening) of the plurality of grooves 01 is the same, and realizes that the modulus of the material of the flexible supporting layer 1 increases in the curl direction (as shown by the arrow) of the flexible display apparatus merely by changing the depths of different grooves 01. Obviously, the situation that in the curl direction of the flexible display apparatus, the density (density of the opening) of the grooves 01 decreases, and the depths of the grooves 01 also decrease may also be adopted. By reasonably adjusting the density of the grooves 01 and the depths of the grooves 01, it may also be realized that in the curl direction of the flexible display apparatus, the modulus of the material of the flexible supporting layer 1 per unit volume increases.

Specifically, the processing technologies for opening the flexible supporting layer mainly include etching, stamping, wire-electrode cutting, laser cutting and the like, and according to the product demand, the cost advantages and disadvantages are integrated, and various processing schemes can be considered preferably. In order to realize opening schemes of different depths in FIG. 6, the adjustment of opening depth mainly considers etching schemes, and controls etching medical solution and reaction time adjustment to realize opening depth design.

Optionally, in the flexible supporting layer provided by the embodiments of the present disclosure, as shown in FIG. 3 to FIG. 6, the shape of the plurality of grooves 01 may be a rectangle, but not limited to a rectangular hole, and may also be a square, a circle, an ellipse or an irregular hole.

Optionally, in the flexible supporting layer provided by the embodiments of the present disclosure, as shown in FIG. 3 to FIG. 6, the material of the flexible supporting layer 1 may be metal, and the metal is made of stainless steel or shape memory alloys.

In conclusion, according to the flexible supporting layer, design of the curl strain accumulation is protected, the technical solutions of three adjustment strain accumulation (equivalent modulus) are protected, that is, (1) the adjustment of opening density, (2) the adjustment opening size and (3) the adjustment of opening depth. The whole design can realize the purpose that different regions have different equivalent moduli according to the requirements, the requirement of eliminating the stain accumulation in the process of movement of a new form display module is met, and the specific design may refer to an empirical formula summarized by instances or a calculated value obtained by simulation.

Figure 7:
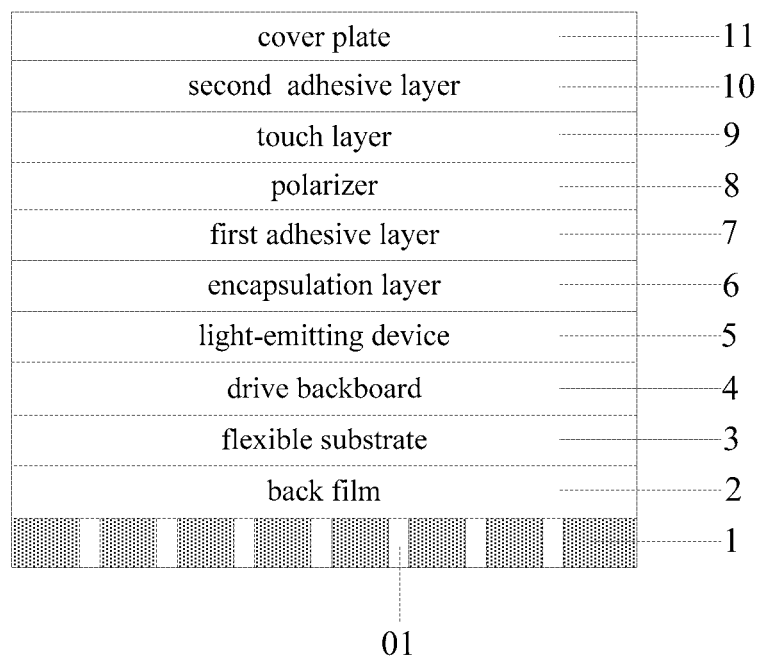
FIG. 7 is a schematic cross-sectional view of a flexible display apparatus provided by an embodiment of the present disclosure.

Based on the same inventive concept, the embodiments of the present disclosure further provide a flexible display apparatus, as shown in FIG. 7, including:
a flexible substrate 3;
a flexible display device 5, arranged on the flexible substrate 3; and
the flexible supporting layer 1, arranged on one side of the flexible substrate 3 facing away from the flexible display device 5.

The display apparatus solves the problem in a similar way to the flexible supporting layer, thus, the implementation of the display apparatus may refer to the implementation of the flexible supporting layer, and repetition will not be repeated here.

Optionally, the flexible display apparatus provided by the embodiments of the present disclosure, as shown in FIG. 7, further includes: a drive circuit layer 4 arranged between the flexible display device 5 and the flexible substrate 3, a back film 2 arranged between the flexible substrate 3 and the flexible supporting layer 1, and an encapsulation layer 6, a first adhesive layer 7, a polarizer 8, a touch layer 9, a second adhesive layer 10 and a cover plate 11 which are stacked in sequence and located on one side of the flexible display device 5 facing away from the flexible substrate 3.

Certainly, the flexible display apparatus provided by the embodiments of the present disclosure may further include other functional film layers well known by the persons skilled in the art, which is not repeated in detail here.

Specifically, the flexible display apparatus provided by the embodiments of the present disclosure is an organic luminescent display apparatus.

The flexible display apparatus provided by the embodiments of the present disclosure may be products or components with any display functions such as a mobile phone, a tablet personnel computer, a monitor, a notebook computer, a digital photo frame and a navigator. Other essential components of the display apparatus are understood by ordinary technicians in the field and shall not be described herein and shall not be constructed as a limitation on the present disclosure.

In the flexible supporting layer and the flexible display apparatus provided by the embodiments of the present disclosure, the flexible supporting layer is applied in the flexible display apparatus, and in the curl direction of the flexible display apparatus, the content of the material of the flexible supporting layer increases. That is, by arranging the material of the flexible supporting layer with the adjustable modulus, the equivalent modulus of the material in the part of the flexible supporting layer as the curl inner circle layer is reduced to meet the curl deformation demand, the equivalent modulus of the material in the another part of the flexible supporting layer as the curl outer circle layer is increased to minimize the film layer deformation caused by stress accumulation is reduced. When the flexible supporting layer of the embodiments of the present disclosure is applied to the flexible display apparatus, strain accumulation borne on the material of the curl outer circle layer may be relieved by adjusting the modulus of the material of the flexible supporting layer, so that more strain accumulated at the winding end is avoided, the condition that each layer of structure in the flexible display apparatus is prone to being broken at the winding end or parts between each layer of structure are prone to peeling off at the winding end is avoided, and the dependability of the flexible display apparatus is improved. In addition, because the film material production process of an upper layer of the flexible substrate in the flexible display apparatus is mostly coiled material cutting molding, and in order to meet the evenness of thickness and optical functions, equivalent modulus adjustment is difficult to carry out, by adopting the patterned flexible supporting layer, equivalent modulus of the whole material of the display apparatus at different regions may be readjusted to meet the requirements of different deformation modes for the flexible supporting layer.

Although the preferred embodiments of the present disclosure have been described, additional modifications and variations may be made to these embodiments once the basic creative concepts are known to those skilled in the field. Therefore, the attached claims are intended to be construed to include the preferred embodiments and all modifications and variations falling within the scope of the disclosure.

It will be apparent to those skilled in the art that various modifications and variations can be made in the present disclosure without departing from the spirit or scope of the present disclosure. Thus, if the modifications and variations of the embodiments of the present disclosure fall within the scope of the appended claims of the present disclosure and their equivalents, the present disclosure is also intended to include such modifications and variations.

What is claimed is:

1. A flexible supporting layer, applied in a flexible display apparatus, wherein:
   in a curl direction of the flexible display apparatus, a content of a material of the flexible supporting layer per unit volume increases.

2. The flexible supporting layer according to claim 1, wherein:
   the flexible supporting layer is provided with a plurality of grooves, and in the curl direction of the flexible display apparatus, a proportion of grooves per unit volume decreases.

3. The flexible supporting layer according to claim 2, wherein:
   the plurality of grooves are arranged in an array, all the plurality of grooves are of a same size, and in the curl direction of the flexible display apparatus, a quantity of the grooves per unit volume decreases.

4. The flexible supporting layer according to claim 2, wherein:
   the plurality of grooves are arranged in an array; and
   in the curl direction of the flexible display apparatus, a quantity of the grooves per unit volume is the same, and sizes of the grooves in different unit volumes decrease.

5. The flexible supporting layer according to claim 4, wherein:
   depths of all the plurality of grooves are the same; and
   in the curl direction of the flexible display apparatus, lengths of the grooves in different unit volumes are the same, and widths of the grooves in different unit volumes decrease.

6. The flexible supporting layer according to claim 4, wherein:
   depths of all the plurality of grooves are the same; and
   in the curl direction of the flexible display apparatus, lengths of the grooves in different unit volumes decrease, and widths of the grooves in different unit volumes are the same.

7. The flexible supporting layer according to claim 5, wherein the plurality of grooves are a plurality of vias penetrating through the flexible supporting layer.

8. The flexible supporting layer according to claim 2, wherein in the curl direction of the flexible display apparatus, lengths and widths of the plurality of grooves are the same, and depths of the grooves in different unit volumes decrease.

9. The flexible supporting layer according to claim 1, wherein shapes of the plurality of grooves comprise a rectangle, a square, a circle, an ellipse or an irregular shape.

10. The flexible supporting layer according to claim 1, wherein a material of the flexible supporting layer is metal, and the metal is a stainless steel or a shape memory alloy.

11. A flexible display apparatus, comprising:
    a flexible substrate;
    a flexible display device, arranged on the flexible substrate; and
    a flexible supporting layer, arranged on a side of the flexible substrate facing away from the flexible display device;
    wherein in a curl direction of the flexible display apparatus, a content of a material of the flexible supporting layer per unit volume increases.

12. The flexible display apparatus according to claim 11, further comprising: a drive circuit layer arranged between the flexible display device and the flexible substrate, a back film arranged between the flexible substrate and the flexible supporting layer, and an encapsulation layer, a first adhesive layer, a polarizer, a touch layer, a second adhesive layer and a cover plate which are stacked in sequence and arranged on a side of the flexible display device facing away from the flexible substrate.

13. The flexible display apparatus according to claim 11, wherein:
    the flexible supporting layer is provided with a plurality of grooves, and in the curl direction of the flexible display apparatus, a proportion of grooves per unit volume decreases.

14. The flexible display apparatus according to claim 13, wherein:
    the plurality of grooves are arranged in an array, all the plurality of grooves are of a same size, and in the curl direction of the flexible display apparatus, a quantity of the grooves per unit volume decreases.

15. The flexible display apparatus according to claim 13, wherein:
    the plurality of grooves are arranged in an array; and
    in the curl direction of the flexible display apparatus, a quantity of the grooves per unit volume is the same, and sizes of the grooves in different unit volumes decrease.

16. The flexible display apparatus according to claim 15, wherein:
    depths of all the plurality of grooves are the same; and
    in the curl direction of the flexible display apparatus, lengths of the grooves in different unit volumes are the same, and widths of the grooves in different unit volumes decrease.

17. The flexible display apparatus according to claim 15, wherein:
    depths of all the plurality of grooves are the same; and in the curl direction of the flexible display apparatus, lengths of the grooves in different unit volumes decrease, and widths of the grooves in different unit volumes are the same.

18. The flexible display apparatus according to claim 17, wherein the plurality of grooves are a plurality of vias penetrating through the flexible supporting layer.

19. The flexible display apparatus according to claim 13, wherein in the curl direction of the flexible display apparatus, lengths and widths of the plurality of grooves are the same, and depths of the grooves in different unit volumes decrease.

20. The flexible display apparatus according to claim 11, wherein shapes of the plurality of grooves comprise a rectangle, a square, a circle, an ellipse or an irregular shape.

* * * * *